US011127831B2

(12) United States Patent
Liu et al.

(10) Patent No.: US 11,127,831 B2
(45) Date of Patent: Sep. 21, 2021

(54) TRANSISTOR STRUCTURE WITH OVERLYING GATE ON POLYSILICON GATE STRUCTURE AND RELATED METHOD

(71) Applicant: GLOBALFOUNDRIES U.S. Inc., Santa Clara, CA (US)

(72) Inventors: Qizhi Liu, Lexington, MA (US); Vibhor Jain, Williston, VT (US); John J. Pekarik, Underhill, VT (US); Judson R. Holt, Ballston Lake, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/788,914

(22) Filed: Feb. 12, 2020

(65) Prior Publication Data

US 2021/0091200 A1    Mar. 25, 2021

Related U.S. Application Data

(60) Provisional application No. 62/904,998, filed on Sep. 24, 2019.

(51) Int. Cl.
*H01L 29/423* (2006.01)
*H01L 21/8238* (2006.01)
(Continued)

(52) U.S. Cl.
CPC ........... *H01L 29/42376* (2013.01); *H01L 21/823814* (2013.01); *H01L 21/823835* (2013.01); *H01L 21/823842* (2013.01); *H01L 21/823871* (2013.01); *H01L 27/0922* (2013.01); *H01L 29/0847* (2013.01); *H01L 29/456* (2013.01); *H01L 29/4916* (2013.01); *H01L 29/7831* (2013.01)

(58) Field of Classification Search
CPC ........... H01L 29/42376; H01L 29/0847; H01L 29/456; H01L 29/4916; H01L 29/7831; H01L 27/0922; H01L 21/823814; H01L 21/823842; H01L 21/823871
USPC ........................................................ 257/384
See application file for complete search history.

(56) References Cited

U.S. PATENT DOCUMENTS 4,417,385 A * 11/1983 Temple ................. H01L 21/033
                                                              438/138
5,650,342 A    7/1997 Satoh et al.
(Continued)

OTHER PUBLICATIONS

Doris et al., "High Performance FDSOI CMOS Technology with Metal Gate and High-k," 2005 Symposium on VLSI Technology Digest of Technical Papers, pp. 214-215.

*Primary Examiner* — Tong-Ho Kim
(74) *Attorney, Agent, or Firm* — Hoffman Warnick LLC

(57) ABSTRACT

Embodiments of the disclosure provide a transistor structure and methods to form the same. The transistor structure may include an active semiconductor region with a channel region between a first source/drain (S/D) region and a second S/D region. A polysilicon gate structure is above the channel region of the active semiconductor region. An overlying gate is positioned on the polysilicon gate structure. A horizontal width of the overlying gate is greater than a horizontal width of the polysilicon gate structure. The transistor structure includes a gate contact to the overlying gate.

18 Claims, 5 Drawing Sheets

(51) Int. Cl.
*H01L 29/08* (2006.01)
*H01L 29/45* (2006.01)
*H01L 27/092* (2006.01)
*H01L 29/78* (2006.01)
*H01L 29/49* (2006.01)

(56) References Cited

U.S. PATENT DOCUMENTS

| | | |
|---|---|---|
| 6,870,232 B1 | 3/2005 | Chan et al. |
| 6,891,235 B1 | 5/2005 | Furukawa et al. |
| 7,105,934 B2 | 9/2006 | Anderson et al. |
| 7,851,884 B2 | 12/2010 | Asai et al. |
| 9,419,141 B2 | 8/2016 | Huang et al. |
| 2011/0254090 A1 | 10/2011 | Cheng et al. |

\* cited by examiner

TRANSISTOR STRUCTURE WITH OVERLYING GATE ON POLYSILICON GATE STRUCTURE AND RELATED METHOD

BACKGROUND

The present disclosure provides a field-effect transistor with an overlying gate over a polysilicon gate structure, and related methods to form the same.

In the microelectronics industry as well as in other industries involving construction of microscopic structures, there is a continued desire to reduce the size of structural features and microelectronic devices and/or to provide a greater amount of circuitry for a given chip size. Miniaturization in general allows for increased performance (more processing per clock cycle and less heat generated) at lower power levels and lower cost. Present technology is at atomic level scaling of certain micro-devices such as logic gates, FETs, and capacitors. Circuit chips with hundreds of millions of such devices are common.

Circuit fabricators are currently seeking to reduce the two-dimensional area occupied by device components, e.g., to reduce two dimensional area and power consumption. As circuit components continue to shrink, greater numbers of devices may be formed in close proximity. Although device density continues to increase, transistors with relatively wide horizontal dimensions may be preferable in some applications. When transistors of such a scale are used, contacts to the transistor gates may not be formed directly on the gate and/or gate silicide material. Misalignment between a contact and its underlying gate may arise, e.g., from mismatch between the device's typical contact spacing and the horizontal width of a particular transistor. In cases where the gate contact is not formed directly on the transistor gate's upper surface, the gate resistance of the transistor may be higher than anticipated during operation.

SUMMARY

The illustrative aspects of the present disclosure are designed to solve the problems herein described and/or other problems not discussed.

Embodiments of the disclosure provide a transistor structure including: an active semiconductor region including a channel region between a first source/drain (S/D) region and a second S/D region; a polysilicon gate structure above the channel region of the active semiconductor region; an overlying gate on the polysilicon gate structure, wherein a horizontal width of the overlying gate is greater than a horizontal width of the polysilicon gate structure; and a gate contact to the overlying gate.

Further embodiments of the disclosure provide an integrated circuit (IC) structure, including: a first transistor on a substrate, the first transistor including: a first active semiconductor region including a channel region between a first source/drain (S/D) region and a second S/D region, wherein the first active semiconductor region is of a first doping type, a first polysilicon gate structure above the channel region of the first active semiconductor region, and a first overlying gate on the first polysilicon gate structure, wherein a horizontal width of the first overlying gate is greater than a horizontal width of the first polysilicon gate structure, and the first overlying gate is of a second doping type opposite the first doping type; a second transistor on the substrate and horizontally separated from the first transistor, the second transistor including: a second active semiconductor region including a channel region between a first S/D region and a second S/D region; wherein the second active semiconductor region is of the second doping type, a second polysilicon gate structure above the channel region of the second active semiconductor region, and a second overlying gate on the second polysilicon gate structure, wherein a horizontal width of the second overlying gate is greater than a horizontal width of the second polysilicon gate structure, and the second overlying gate is of the first doping type; and a plurality of gate contacts including a first gate contact to the first overlying gate and a second gate contact to the second overlying gate.

Additional embodiments of the disclosure provide a method of forming an IC structure, the method including: providing a structure including an active semiconductor region on a substrate, wherein the active semiconductor region includes a channel region between a first source/drain (S/D) region and a second S/D region; forming a polysilicon gate structure on the channel region of the active semiconductor region; forming an overlying gate on the polysilicon gate structure, such that a horizontal width of the overlying gate is greater than a horizontal width of the polysilicon gate structure; and forming a gate contact to the overlying gate, such that the overlying gate separates the gate contact from the polysilicon gate structure.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
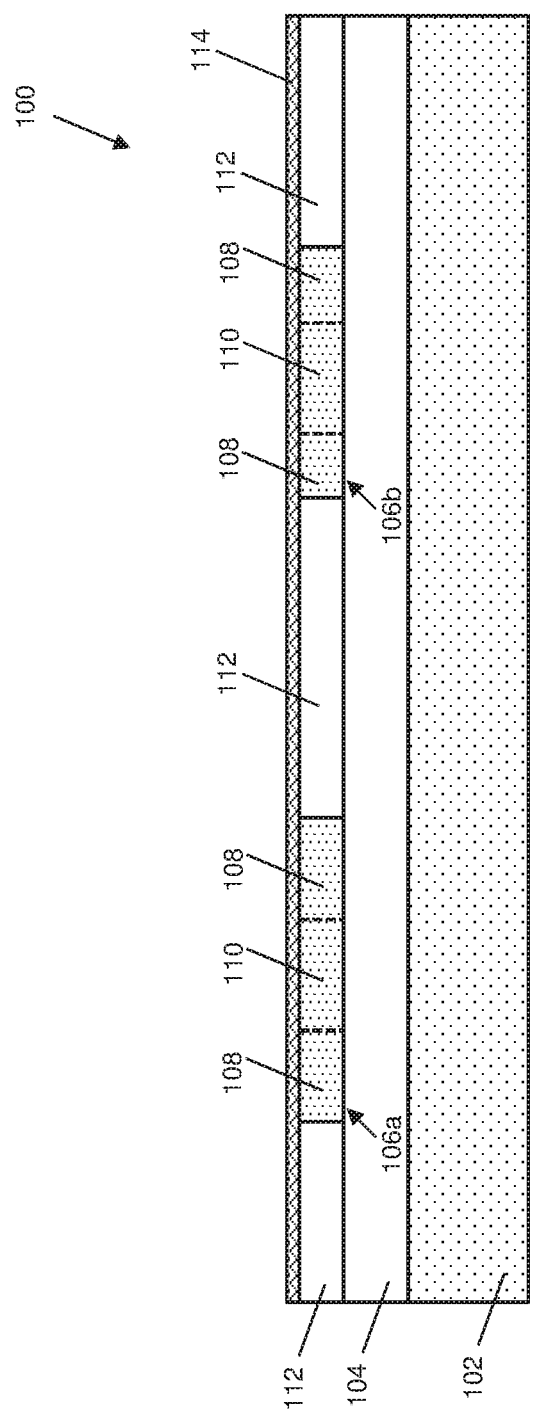
FIG. 1 shows a cross-sectional view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

Embodiments of the disclosure provide a transistor structure with an overlying gate over a polysilicon gate structure, and related methods to form the transistor structure. Various embodiments of the disclosure may include, e.g., an overlying gate on a polysilicon gate structure. The overlying gate may have a horizontal width that is greater than that of the polysilicon gate structure. The overlying gate in some cases may be formed by selective growth from underlying polycrystalline silicon, and concurrently with the forming of epitaxial raised source and drain regions. The overlying gate increases the size of a physical interface between the transistor gate and an overlying gate contact, thereby reducing the risk of partial misalignment between the gate structure and gate contact. In some cases, the polysilicon gate structure and overlying gate together may resemble the shape of a T. Embodiments of the disclosure also provide methods to form one or more transistor structures with a polysilicon gate structure and overlying gate thereon. In some cases, multiple transistors of complementary polarity may be provided.

Referring to FIG. 1, embodiments of the disclosure provide methods to form an IC structure. FIG. 1 illustrates an initial structure 100 (simply "structure" hereafter) capable of being processed to form an IC structure according to embodiments of the disclosure. Structure 100 may be formed on a substrate 102 including, e.g., one or more semiconductor materials. Substrate 102 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 102 or a portion thereof may be strained.

An insulative layer 104, also known in the art as a "buried oxide," "buried insulator," or "BOX" layer, can be located on substrate 102. Insulative layer 104 may be composed of one or more oxide compounds, and/or any other currently known or later-developed electrically insulative substances. Insulative layer 104 may be sized as narrow as possible to provide better interaction with semiconductor materials formed thereon, and in various embodiments may have a thickness that is at most approximately twenty-five nanometers (nm). Insulative layer 104 may include, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Structure 100 can include one or more sets of semiconductor material from which multiple transistor structures may be formed. The semiconductor material can be formed in a variety of ways from an initial substrate. Various embodiments may include regions of semiconductor material in the form of a set of active semiconductor layers 106a, 106b (simply "active regions" hereafter) on respective portions of buried insulator layer 104. Active semiconductor layers 106a, 106b each may be subdivided into, e.g., a set of source/drain (S/D) regions 108 and a channel region 110 between S/D regions 108. S/D regions 108 may be distinguished from channel region 110 by having a greater concentration of dopants than channel region 110 as discussed herein, and/or may otherwise be distinguished based on the materials subsequently formed thereon. FIG. 1 provides an example including two active regions 106a, 106b, but structure 100 may include any desired number of active regions 106a, 106b. Although active region(s) 106a, 106b are illustrated as being semiconductor on insulator (SOI) semiconductor regions as an example, embodiments of the disclosure may be formed on any type of semiconductor region (e.g., bulk semiconductor material, FDSOI structures, fin-type field effect transistors (FinFETs), semiconductor nanosheets, etc.) without significant modifications. A group of shallow trench isolations (STIs) 112 of structure 100, may be positioned adjacent to active region(s) 106a, 106b. STIs 112 in some cases may also be positioned at least partially below active region(s) 106a, 106b. STI(s) 112 may be formed of any currently-known or later developed substance for providing electrical insulation, including without limitation the example insulative materials discussed herein with respect to insulator layer 104.

Active region(s) and STI(s) 112 may be covered by a pad insulator 114. Pad insulator 114 may have significantly less vertical thickness than other materials thereunder. According to an example, pad insulator 114 may have a thickness, e.g., in the range of about 50 to about 500 Angstroms (5-50 nanometers (nm)), and can be formed, for example, by thermal oxidation of the substrate. Pad insulator 114 may also be prepared by other methods. For example, silicon dioxide or reactive precursors like silane could be deposited by chemical vapor deposition (CVD). Pad insulator 114 may protect underlying materials from being inadvertently affected (e.g., removed, modified, etc.) during subsequent processing of structure 100.

Figure 2:
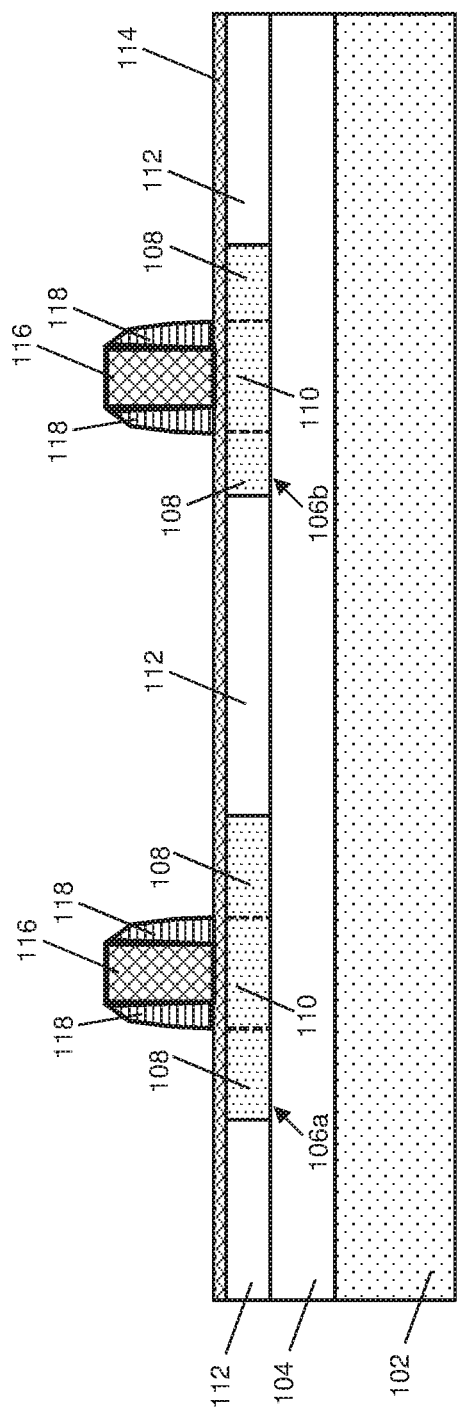
FIG. 2 shows a cross-sectional view of forming a set of polysilicon gate structures according to embodiments of the disclosure.

Referring to FIG. 2, methods according to the disclosure may include forming one or more polycrystalline silicon (simply "polysilicon" hereafter) gate structures 116 on active region(s) 106a, 106b. Polysilicon gate structures 116 may be formed, e.g., by deposition over channel region(s) 110. Deposition or "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Polysilicon gate structures 116 may not be electrically conductive at the time of their initial deposition. In some cases, a remaining portion of pad insulator 114 may function as a gate dielectric layer for polysilicon gate structure 116, while in other embodiments an additional gate dielectric layer (not shown) may be formed before polysilicon gate structure 116 is formed. In other examples, portions of pad insulator 114 may be removed and replaced with one or more gate dielectric materials, e.g., insulators such as hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), high-k material (i.e., any material having a dielectric constant of more than 3.9) or any combination of these materials.

Polysilicon gate structures 116 may become electrically conductive through the implantation of dopants. The doping of semiconductive material, e.g., polysilicon gate structure 116, with P-type and/or N-type dopants is a foundational process to form a transistor. Doping is the process of introducing impurities (dopants) into the semiconductor substrate, or elements formed on the semiconductor substrate, and is often performed with a mask (or previously-formed, elements in place) so that only certain areas of the substrate will be doped. A "dopant" refers to an element introduced into a semiconductor to establish either P-type (acceptors) or N-type (donors) conductivity. Dopants are of two types: "donors" and "acceptors." N type implants are donors and P type are acceptors. In the case of a silicon substrate, common dopants may include, e.g., boron (B), and/or indium (In), for P-type doping. For N-type doping, the doped element(s) may include, for example, phosphorous (P) arsenic (As), and/or antimony (Sb). P-type and N-type doping types may themselves may be further characterized by their doping intensity relative to a baseline doping concentration for the material. P-type doped materials with an elevated number of "holes," i.e., charge carriers having a positive charge, are classified as being P+ doped. P-type doped materials carrying a greatly diminished number of electrons are classified as being P− doped. N-type doped materials with an elevated number of electrons are classified as being N+ doped. N-type doped materials carrying a greatly diminished number of holes are classified as being N-doped. Polysilicon gate structures 116 may be doped after being formed over active region(s) 106a, 106b, or alternatively may be doped before being deposited over active regions 106. In some cases, polysilicon gate structures 116 maybe deposited directly onto pad insulator 114. In other implementations, some portions of pad insulator 114 may be removed (e.g., by etching) before polysilicon gate structures 116 are formed.

Embodiments of the disclosure may also include forming one or more spacers 118 adjacent to polysilicon gate structure(s) 116. Spacer(s) 118 may be provided as one or more bodies of insulating material formed above active region(s) 106a, 106b, e.g., by deposition/etching, thermal growth, etc. Spacer(s) 118 may be formed adjacent to polysilicon gate structure(s) 116 to electrically and physically separate polysilicon gate structure(s) 116 from other components. Spacer(s) 118 may include one or more low-K dielectric materials, i.e., dielectric materials with a dielectric constant of at most approximately 3.9. Spacer 118, for example, may include one or more insulative oxide and/or nitride materials. In some cases, spacer(s) 118 may include one or more insulative materials included in buried insulator layer 104 or a different insulative material.

Figure 3:
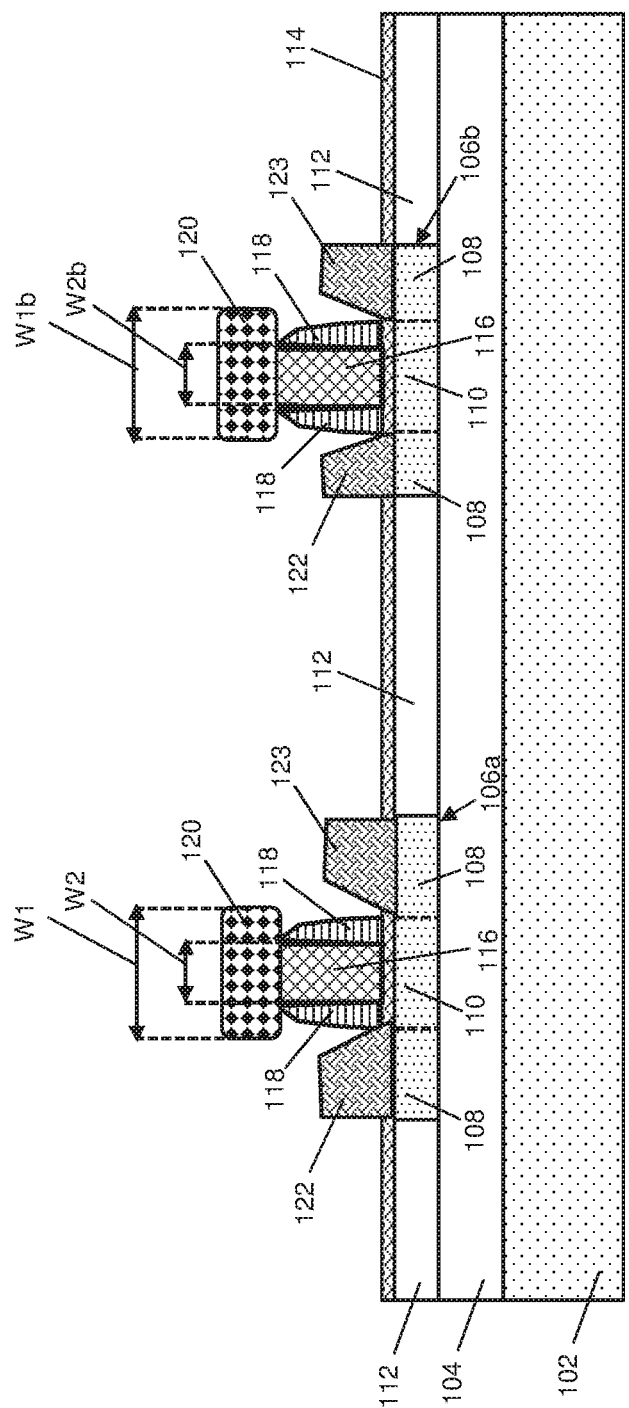
FIG. 3 shows a cross-sectional view of forming overlying gates and raised source/drain (S/D) regions according to embodiments of the disclosure.

Referring now to FIG. 3, embodiments of the disclosure may differ from conventional processes to form a transistor structure by forming additional doped semiconductor material above polysilicon gate structure(s) 116, as well as spacer(s) 118 where applicable. The additionally formed material(s) may allow overlying contacts to interface more easily with polysilicon gate structure(s) 116 through the overlying material(s). One or more overlying gates 120 may also be formed concurrently on polysilicon gate structure(s) 116 by growing additional semiconductor material from exposed surfaces of polysilicon gate(s) 116. The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

At the time of formation, overlying gate(s) 120 may have the same doping type and/or a similar doping concentration as polysilicon gate structure(s) 118, e.g., as a result of being grown from the underlying material. According to an example, overlying gate 120 may include silicon germanium (SiGe) and/or other semiconductive materials. Overlying gate(s) 120 in some cases may be undoped at the time of formation. In this case, overlying gate(s) 120 may be implanted with additional dopants to increase their electrical conductivity after being formed. In some embodiments, overlying gate(s) 120 may have an opposite doping type from their underlying active region(s) 106a, 106b. According to one example, one active region 106a may be doped P-type while its overlying gate 120 may be doped N-type. In a complementary metal oxide semiconductor (CMOS) device structure, active region 106b adjacent active region 106a may be doped N-type while its overlying gate 120 may be doped P-type. Thus, multiple overlying gates 120 of one device may have different doping types and/or concentrations, which may be the opposite doping type of active region(s) 106a, 106b thereunder.

The deposition and/or growth time to form overlying gate(s) 120 may be selected such that overlying gate(s) 120 have a greater width than their underlying polysilicon gate structure(s) 116. For example, overlying gate(s) 120 may have a first horizontal width W1 that is greater than a second horizontal width W2 of polysilicon gate structure 116 thereunder. In an example, first width W1 may be at least twice as large as second width W2. In some embodiments, overlying gate(s) 120 may include a lower surface in direct physical contact with an upper surface of spacer(s) 118, and may laterally overhang the outer sidewall(s) of spacer(s) 118.

Embodiments of the disclosure may additionally include forming a raised epitaxial source 122 on one S/D region 108 and a raised epitaxial drain 123 on another S/D region 108. Selected portions of pad insulator 114 may be removed, e.g., by etching, to expose S/D regions 108 to allow epitaxial materials to be grown thereon. Polysilicon gate structure 116 and overlying gate 120 may be located between raised epitaxial source 122 and raised epitaxial drain 123 to define three conductive terminals of a transistor structure. Raised epitaxial source 122 and raised epitaxial drain 123 each may include a doped semiconductor material (e.g., SiGe), and in some cases may include the same semiconductor material and/or dopants as doped semiconductor region 120. Thus, overlying gate 120, raised epitaxial source 122, and/or raised epitaxial drain 123 may be formed concurrently using the same implementation(s) of epitaxial growth. The forming of raised epitaxial source 122 and raised epitaxial drain 123 by epitaxial growth may cause raised epitaxial source 122 and raised epitaxial drain to protrude upwardly above pad insulator 114. Raised epitaxial source 122 and raised epitaxial drain 123 may have the same doping type as doped semiconductor region 120, and thus may also be doped concurrently with doped semiconductor region 120.

Figure 4:
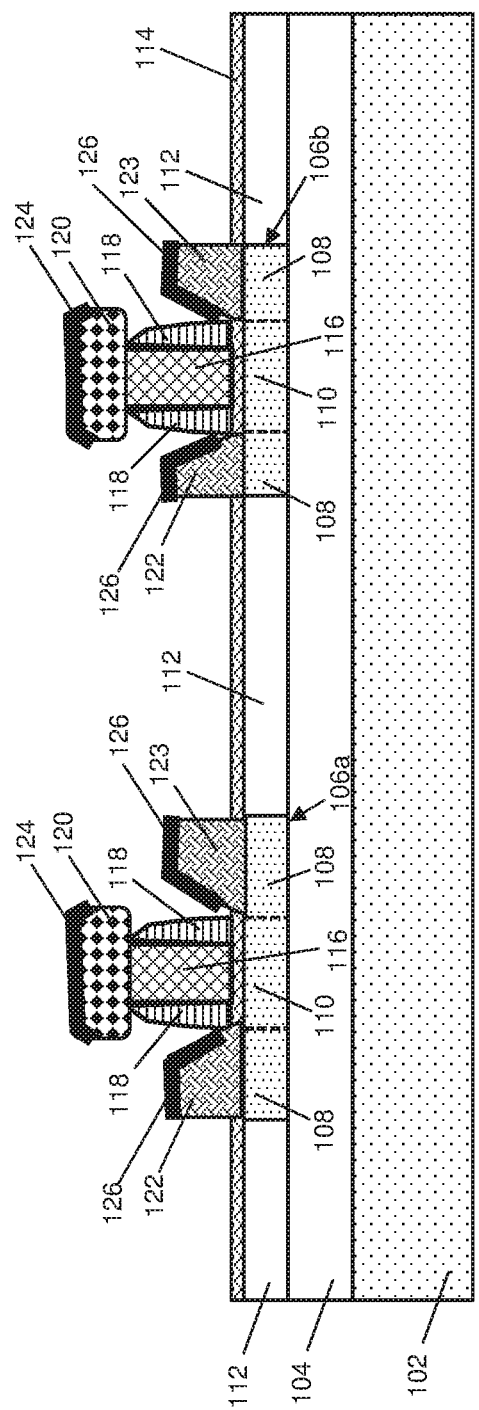
FIG. 4 shows a cross-sectional view of forming gate silicide regions and S/D silicide regions according to embodiments of the disclosure.

Referring now to FIG. 4, embodiments of the disclosure may include forming a gate silicide region 124 on overlying gate 120. The disclosure additionally or alternatively may include forming a set of S/D silicide regions 126 on raised epitaxial source 122 and/or raised epitaxial drain 123. In any case, gate silicide region 124 and/or S/D silicide region(s) 126 may include, e.g., one or more layers of conductive material formed using any now known or later developed technique on underlying semiconductor material (e.g., overlying gate 120). Silicide region(s) 124, 126 may be formed, e.g., after the doping of the underlying semiconductor but before the forming of conductive contacts.

Silicide region(s) 124, 126 may be formed by performing an in-situ pre-clean, depositing a metal such as titanium, nickel, cobalt, etc., annealing to have the metal react with silicon, and removing unreacted metal. Silicide region(s) 124, 126 thus may include one or more of tungsten silicide, tungsten nitride, titanium nitride, tantalum nitride, ruthenium oxide, cobalt silicide, and/or nickel silicide, depending on the type of metal deposited and annealed and/or the type of underlying semiconductor material(s). In the case of gate silicide region(s) 124, the deposited metal and resulting silicide material may be present on an upper surface and sidewalls of overlying gate 120 to further reduce the possibility of misalignment between gate silicide region(s) 124 and contacts formed thereto. In some embodiments, gate silicide region(s) 124 may have a different material composition from that of S/D silicide region(s) 126. Specifically, the metals used to form gate silicide region(s) 124 may be less conductive than S/D silicide region(s) 126 to increase the responsiveness of polysilicon gate structure 116 to varying voltages. According to one example, the composition of gate silicide region(s) 124 may have a resistivity of at least thirty Ohm-meters while the composition of S/D silicide region(s) 126 may have a resistivity of at most fifteen Ohm-meters. In such an example, gate silicide region(s) 124 may include tungsten silicide while S/D silicide region(s) 126 may include nickel silicide.

Figure 5:
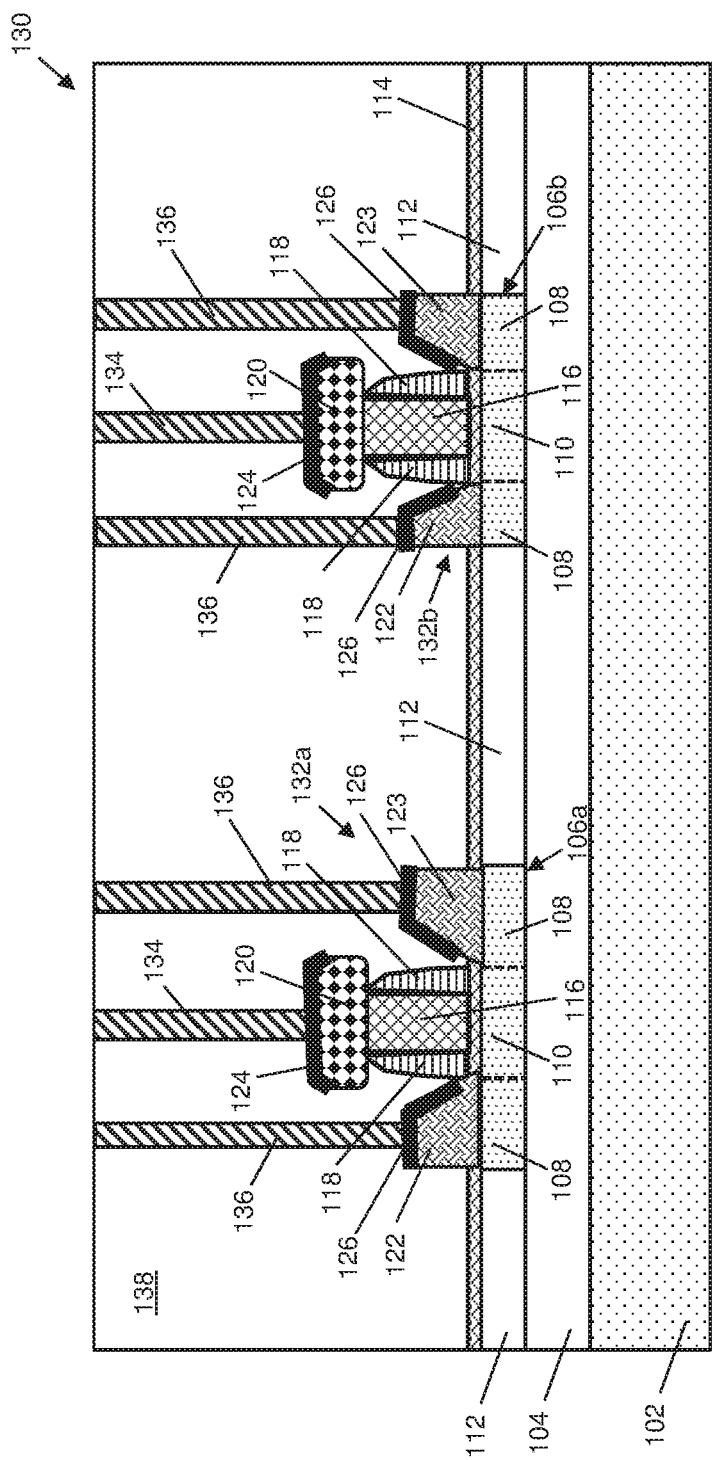
FIG. 5 shows a cross-sectional view of forming gate contacts to yield a set of transistor structures according to embodiments of the disclosure.

Referring to FIG. 5, further processing of the materials discussed herein may yield an IC structure 130 which includes, e.g., one or more transistors 132a, 132b each having overlying gate(s) 120 over polysilicon gate structure(s) 118. Transistor 132a may be referred to as a "first transistor structure" while transistor 132b may be referred to as a "second transistor structure." The continued processing may include the forming of Middle of the Line (MOL) contacts. Such contacts may include one or more gate contacts 134 to overlying gate 120 and S/D contacts 136 to S/D regions 108. MOL processing may include, e.g., forming an inter-layer dielectric (ILD) 138 over the previously-formed materials to a desired height. ILD 138 may include one or more insulators described herein with respect to buried insulator layer 104 or pad insulator 114, and/or may include any other currently known or later developed insulative material.

After ILD 138 is formed, a set of openings (not shown) may be formed within ILD 138 and filled with conductive materials to form gate contact(s) 134 and/or S/D contacts 136. Contact(s) 134, 136 additionally may include, e.g., refractory metal liners (not shown) to horizontally separate conductive materials of contact(s) 134, 136 from ILD 138 and/or other horizontally adjacent materials (not shown). Such liners may include materials such as but not limited to: tantalum nitride (TaN) and tantalum; tantalum nitride, tantalum and cobalt; and magnesium (Mn), or combinations thereof. Despite possible differences in the doping type of active region(s) 106a, 106b, overlying gate(s) 120, raised epitaxial source 122, and/or raised epitaxial drain 123, contact(s) 134, 136 optionally may have the same composition(s) and may be formed concurrently. Additionally, the prior forming of overlying gate(s) 120 may reduce the risk of gate contacts 134 being misaligned with an electrical pathway to polysilicon gate structure 116. Where silicide region(s) 124, 126 are included, such region(s) 124, 126 may be positioned directly between a respective contact 134, 136 and underlying semiconductor material (e.g., overlying gate 120, raised epitaxial source 122, or raised epitaxial drain 123).

Various methods according to the disclosure may yield transistor structures 132a, 132b with at least some of the structures or components described herein and their accompanying technical features. Transistor structure(s) 132a, 132b according to embodiments of the disclosure may include active region 106 including channel region 110 between S/D regions 108. Polysilicon gate structure 116 may be above channel region 110, and in some cases, may be located on a remaining portion of pad insulator 114. Overlying gate 120 may be located on polysilicon gate structure 116, and may include first width W1 (FIG. 3) that is greater than second width W2 (FIG. 3) of polysilicon gate structure 116. Gate contact 134 may electrically couple overlying gate 120 to an overlying structure, e.g., a metal wire or via (not shown). The various additional components discussed herein relative to methods according to the disclosure, e.g., raised epitaxial source 122, raised epitaxial drain 123, silicide region(s) 124, 126, and/or S/D contacts 136, may also be formed on within transistor structure(s) 132a, 132b where desired. In still further implementations, each transistor structure 132a, 132b may include active regions 106a, 106b, overlying gates 120, raised epitaxial source(s) 122, and/or raised epitaxial drain(s) 123 of different types. More specifically, a set of two or more transistor structures 132a, 132b on substrate 102 may feature complementary (i.e., opposite) doping as discussed herein.

Various embodiments of the disclosure may provide technical and commercial advantages, some of which are described by example herein. Embodiments of the disclosure may expand the surface area available for forming contacts to a transistor gate, without expanding or otherwise changing the dimensions of the underlying transistor or its primary terminals. For example, embodiments of the disclosure may reduce or eliminate the need to form wider FET structures at some locations on a device. As noted throughout the disclosure, embodiments of the disclosure may reduce or eliminate the possibility of misalignment between a transistor gate and its overlying contact by forming conductive epitaxial materials (i.e., overlying gate(s) 120) over polysilicon gate structure 116 without needing to increase the size of polysilicon gate structure(s) 116. Embodiments of the disclosure may also be integrated easily into other processing paradigms, and in particular may allow for the concurrent forming of raised epitaxial source 122 and/or raised epitaxial drain 123 with a single instance of epitaxial growth. Methods of the disclosure may cause polysilicon gate 116 and overlying gate 120 to have a distinct "T" shape, with the upper portion of the T offering a wider horizontal surface area to accommodate gate contact(s) 134.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

What is claimed is:

1. A transistor structure comprising:
an active semiconductor region including a channel region between a first source/drain (S/D) region and a second S/D region;
a polysilicon gate structure above the channel region of the active semiconductor region;
an overlying gate on the polysilicon gate structure, wherein a horizontal width of the overlying gate is greater than a horizontal width of the polysilicon gate structure;
a gate contact to the overlying gate; and
a gate silicide region on at least an upper surface and a sidewall of the overlying gate, wherein the gate silicide region is vertically between a top surface of the overlying gate and a bottom surface of the gate contact.

2. The transistor structure of claim 1, further comprising a spacer horizontally adjacent to the polysilicon gate structure, wherein an upper surface of the spacer contacts a lower surface of the overlying gate.

3. The transistor structure of claim 2, wherein the horizontal width of the overlying gate is greater than a combined horizontal width of the polysilicon the gate structure and the spacer.

4. The transistor structure of claim 2, wherein the overlying gate laterally overhangs a sidewall of the spacer.

5. The transistor structure of claim 1, further comprising:
a raised epitaxial source on the first S/D region; and
a raised epitaxial drain on the second S/D region, wherein the overlying gate, the raised epitaxial source, and the raised epitaxial drain have a same material composition.

6. The transistor structure of claim 5, further comprising:
an S/D silicide region on the raised epitaxial source or the raised epitaxial drain, wherein the S/D silicide region has a different material composition from the gate silicide region.

7. An integrated circuit (IC) structure, comprising:
a first transistor on a substrate, the first transistor including:
a first active semiconductor region including a channel region between a first source/drain (S/D) region and a second S/D region, wherein the first active semiconductor region is of a first doping type,
a first polysilicon gate structure above the channel region of the first active semiconductor region, and
a first overlying gate on the first polysilicon gate structure, wherein a horizontal width of the first overlying gate is greater than a horizontal width of the first polysilicon gate structure, and the first overlying gate is of a second doping type opposite the first doping type;
a second transistor on the substrate and horizontally separated from the first transistor, the second transistor including:
a second active semiconductor region including a channel region between a first S/D region and a second S/D region;, wherein the second active semiconductor region is of the second doping type,
a second polysilicon gate structure above the channel region of the second active semiconductor region, and
a second overlying gate on the second polysilicon gate structure, wherein a horizontal width of the second overlying gate is greater than a horizontal width of the second polysilicon gate structure, and the second overlying gate is of the first doping type; and
a plurality of gate contacts including a first gate contact to the first overlying gate and a second gate contact to the second overlying gate.

8. The IC structure of claim 7, further comprising a silicide region on at least an upper surface and a sidewall of the first overlying gate or the second overlying gate, wherein the silicide region is positioned between the first overlying gate or the second overlying gate and one of the plurality of gate contacts.

9. The IC structure of claim 7, wherein the first transistor or the second transistor further includes a spacer adjacent a sidewall of the polysilicon gate structure thereof, wherein an upper surface of the spacer contacts a lower surface of the first overlying gate or the second overlying gate.

10. The IC structure of claim 9, wherein the horizontal width of the first overlying gate or the second overlying gate is greater than a combined horizontal width of the spacer and the first polysilicon gate structure or the second polysilicon gate structure.

11. The IC structure of claim 9, wherein the first overlying gate or the second overlying gate laterally overhangs a sidewall of the spacer.

12. The IC structure of claim 7, wherein the first transistor further includes:
a raised epitaxial source on the first S/D region; and
a raised epitaxial drain on the second S/D region, wherein the raised epitaxial source, the raised epitaxial drain, and the first doped epitaxial have a same material composition.

13. The IC structure of claim 7, further comprising:
a gate silicide region on at least an upper surface and a sidewall of the first overlying gate, wherein the gate silicide region is positioned between the first overlying gate or the second overlying gate and one of the plurality of gate contacts; and an S/D silicide region on the raised epitaxial source or the raised epitaxial drain of the first transistor, wherein the S/D silicide region has a different material composition from the gate silicide region.

14. A method of forming an integrated circuit (IC) structure, the method comprising:

providing a structure including an active semiconductor region on a substrate, wherein the active semiconductor region includes a channel region between a first source/drain (S/D) region and a second S/D region;

forming a polysilicon gate structure on the channel region of the active semiconductor region;

forming an overlying gate on the polysilicon gate structure, such that a horizontal width of the overlying gate is greater than a horizontal width of the polysilicon gate structure;

forming a gate silicide region on at least an upper surface and a sidewall of the overlying gate; and forming a gate contact to the gate silicide region of the overlying gate, such that the overlying gate separates the gate contact from the polysilicon gate structure.

15. The method of claim 14, further comprising forming a raised epitaxial source on the first S/D region and a raised epitaxial drain on the second S/D region, wherein the raised epitaxial source and the raised epitaxial drain are formed concurrently with the overlying gate.

16. The method of claim 15, further comprising forming an S/D silicide region on the raised epitaxial source or the raised epitaxial drain, wherein a material composition of the S/D silicide region is different from a material composition of the gate silicide region.

17. The method of claim 14, further comprising forming a spacer adjacent to a sidewall of the polysilicon gate structure, wherein forming the overlying gate causes a lower surface of the overlying gate to contact an upper surface of the spacer.

18. The method of claim 17, wherein forming the overlying gate includes epitaxially growing a doped epitaxial material from the polysilicon gate structure such that the overlying gate laterally overhangs the spacer.

* * * * *